(12) United States Patent
Sakaida et al.

(10) Patent No.: US 10,289,002 B2
(45) Date of Patent: May 14, 2019

(54) ELECTRON BEAM RESIST UNDERLAYER FILM-FORMING COMPOSITION CONTAINING LACTONE-STRUCTURE-CONTAINING POLYMER

(71) Applicant: NISSAN CHEMICAL INDUSTRIES, LTD., Tokyo (JP)

(72) Inventors: Yasushi Sakaida, Toyama (JP); Ryuta Mizuochi, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/106,535

(22) PCT Filed: Dec. 5, 2014

(86) PCT No.: PCT/JP2014/082284
§ 371 (c)(1),
(2) Date: Jun. 20, 2016

(87) PCT Pub. No.: WO2015/093323
PCT Pub. Date: Jun. 25, 2015

(65) Prior Publication Data
US 2016/0363863 A1 Dec. 15, 2016

(30) Foreign Application Priority Data

Dec. 19, 2013 (JP) ................................ 2013-262054

(51) Int. Cl.
| | |
|---|---|
| G03F 7/11 | (2006.01) |
| G03F 7/20 | (2006.01) |
| H01L 21/027 | (2006.01) |
| H01L 21/308 | (2006.01) |
| H01L 21/3065 | (2006.01) |
| C09D 133/06 | (2006.01) |
| C09D 133/14 | (2006.01) |

(52) U.S. Cl.
CPC .............. *G03F 7/11* (2013.01); *C09D 133/06* (2013.01); *C09D 133/066* (2013.01); *C09D 133/14* (2013.01); *G03F 7/2059* (2013.01); *H01L 21/0273* (2013.01); *H01L 21/3065* (2013.01); *H01L 21/3081* (2013.01); *H01L 21/3085* (2013.01); *H01L 21/3086* (2013.01); *H01L 21/3088* (2013.01)

(58) Field of Classification Search
CPC ................... G03F 7/11; G03F 7/2059–7/2063
See application file for complete search history.

(56) References Cited

U.S. PATENT DOCUMENTS

| | | | |
|---|---|---|---|
| 2004/0076904 A1* | 4/2004 | Takahashi | ................. C25F 3/04 430/270.1 |
| 2004/0197709 A1* | 10/2004 | Arase | ...................... G03F 7/038 430/313 |
| 2011/0117746 A1* | 5/2011 | Maruyama | .............. C08L 83/04 438/703 |

FOREIGN PATENT DOCUMENTS

| | | |
|---|---|---|
| JP | 2000-221689 A | 8/2000 |
| JP | 2007-293332 A | 11/2007 |
| JP | 2008-076551 A | 4/2008 |
| JP | 2008-256966 A | 10/2008 |
| JP | 2010-020046 A | 1/2010 |
| JP | 2014-137546 A | 7/2014 |
| TW | 201308017 A | 2/2013 |
| WO | 03017002 A1 | 2/2003 |
| WO | 2008/105266 A1 | 9/2008 |
| WO | 2011/018928 A1 | 2/2011 |
| WO | 2012/017790 A1 | 2/2012 |
| WO | 2012/081619 A1 | 6/2012 |
| WO | WO-2016/047345 A1 * | 3/2016 |

OTHER PUBLICATIONS

English translation of WO 2012/017790 A1 as obtained from WIPO translation, PatentScope website on Sep. 28, 2017, 21 pages.*
English translation of WO 2011/018928 A1 as obtained from WIPO translation, PatentScope website on Mar. 2017, 30 pages.*
English translation of WO 2012/081619 A1 as obtained from WIPO translation, PatentScope website on Sep. 28, 2017, 26 pages.*
Jan. 13, 2015 International Search Report issued in International Patent Application No. PCT/JP2014/082284.
Jan. 13, 2015 Written Opinion of the International Searching Authority issued in International Patent Application No. PCT/JP2014/082284.

* cited by examiner

*Primary Examiner* — Cynthia Hamilton
(74) *Attorney, Agent, or Firm* — Oliff PLC

(57) ABSTRACT

An electron beam resist underlayer film-forming composition includes a polymer containing a unit structure having a lactone ring and a unit structure having a hydroxy group. The polymer may be a polymer obtained by copolymerizing a monomer mixture containing a lactone (meth)acrylate, a hydroxyalkyl (meth)acrylate, and phenyl (meth)acrylate or benzyl (meth)acrylate. A method for producing a semiconductor device including: applying the electron beam resist underlayer film-forming composition onto a substrate and heating the applied composition to form an electron beam resist underlayer film; coating the electron beam resist underlayer film with an electron beam resist; irradiating the substrate coated with the electron beam resist underlayer film and the electron beam resist with an electron beam; developing the substrate; and transferring an image onto the substrate by dry etching to form an integrated circuit element.

12 Claims, 1 Drawing Sheet

ELECTRON BEAM RESIST UNDERLAYER FILM-FORMING COMPOSITION CONTAINING LACTONE-STRUCTURE-CONTAINING POLYMER

TECHNICAL FIELD

The present invention relates to a resist underlayer film composition for electron beam lithography used for a device production process using electron beam lithography, reducing adverse effects caused by electron beams, and effective for obtaining an excellent resist pattern, and a method for forming a resist pattern using the resist underlayer film composition for electron beam lithography.

BACKGROUND ART

The following techniques are cited as prior arts,

An electron beam resist underlayer film-forming composition containing a polymer including halogen atoms has been described (refer to Patent Document 1).

An resist underlayer film-forming composition for electron beam curing containing a polymer having carbon-carbon unsaturated multiple bonds has been described (refer to Patent Document 2).

A silicon-containing resist underlayer film-forming composition for electron beam curing has been described (refer to Patent Document 3).

An antistatic film-forming composition for upper layer of an electron beam resist containing an ionic liquid has been described (refer to Patent Document 4).

An anti-reflective coating-forming composition for UV lithography containing a polymer containing a lactone structure has been described (refer to Patent Document 5).

PRIOR ART DOCUMENTS

Patent Documents

Patent Document 1: International Publication WO 2008/105266 Pamphlet
Patent Document 2: Japanese Patent Application Publication No. 2008-076551 (JP 2008-076551 A)
Patent Document 3: Japanese Patent Application Publication No. 2008-256966 (JP 2008-256966 A)
Patent Document 4: Japanese Patent Application Publication No. 2010-020046 (JP 2010-020046 A)
Patent Document 5: International Publication WO 2003/017002 Pamphlet

SUMMARY OF THE INVENTION

Problem to be Solved by the Invention

In a device production process using electron beam lithography, problems may occur in which an excellent resist pattern having a straight shape cannot be formed because a trailing shape or a undercut shape pattern of the resist for electron beam lithography is formed due to adverse effects caused by a base substrate or electron beams and a sufficient margin to the amount of electron beam irradiation cannot be obtained. Therefore, the electron lithography process does not require a resist underlayer film having anti-reflective function (an anti-reflective coating), but requires a resist underlayer film for electron beam lithography that can reduce the adverse effects described above, form an excellent resist pattern having a straight shape, and obtain a sufficient margin to the amount of electron beam irradiation.

As essential properties, the resist underlayer film for electron beam lithography also requires that, similar to the anti-reflective coating, the underlayer film does not cause intermixing with the resist layer (the resist underlayer film is not dissolved into a resist solvent) because the resist is applied onto the underlayer film after formation of the underlayer film and that low-molecular-weight substances do not diffuse from the electron beam resist underlayer film material into the resist applied onto the underlayer film at the time of application or drying by heating.

In a generation using electron beam lithography, the width of the resist pattern is extremely fine and thus thinner film formation of the resist for electron beam lithography is desired. Consequently, dramatic reduction in the time required for the removal process of an organic anti-reflective coating by etching is required, and a resist underlayer film for electron beam lithography usable as a thin film or a resist underlayer film for electron beam lithography having a high selection ratio of an etching rate to the resist for electron beam lithography is required.

The present invention is to provide a resist underlayer film-forming composition for electron beam lithography used for the electron beam lithography process of semiconductor device production. Another object of the present invention is to provide a resist underlayer film for electron beam lithography that can reduce adverse effects caused by a base substrate and electron beams, form an excellent resist pattern having a straight shape, obtain a sufficient margin to the amount of electron beam irradiation, cause no intermixing with a resist layer, and have higher dry etching rate than that of the resist. Still another object of the present invention is to provide a method for forming the pattern of the resist for electron beam lithography using the resist underlayer film-forming composition for electron beam lithography.

Means for Solving the Problem

The invention in this specification provides, as a first aspect, an electron beam resist underlayer film-forming composition comprising a polymer containing a unit structure having a lactone ring and a unit structure having a hydroxy group, as a second aspect, the electron beam resist underlayer film-forming composition as described in the first aspect, in which the polymer is a polymer further containing a unit structure having an aryl group or an arylalkyl group, as a third aspect, the electron beam resist underlayer film-forming composition as described in the first aspect or the second aspect, in which the polymer is a polymer obtained by copolymerizing a monomer mixture containing a lactone (meth)acrylate and a hydroxyalkyl (meth)acrylate, as a fourth aspect, the electron beam resist underlayer film-forming composition as described in the first aspect or second aspect, in which the polymer is a polymer obtained by copolymerizing a monomer mixture containing a lactone (meth)acrylate, a hydroxyalkyl (meth)acrylate, and phenyl (meth)acrylate or benzyl (meth)acrylate, as a fifth aspect, the electron beam resist underlayer film-forming composition as described in the first aspect or the second aspect, in which the polymer is a polymer of Formula (1) containing a unit structure of Formula (1-1) and a unit structure of Formula (1-2) or a polymer of Formula (2) containing a unit structure of Formula (2-1), a unit structure of Formula (2-2), and a unit structure of Formula (2-3):

Formula (1)

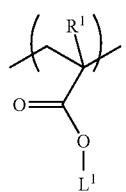

Formula (2)

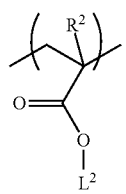

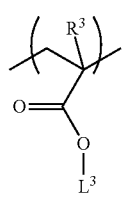

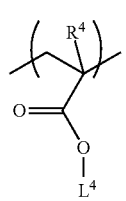

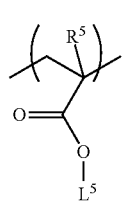

Formula (1-1)

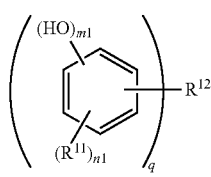

Formula (1-2)

Formula (2-1)

Formula (2-2)

Formula (2-3)

[where $R^1$, $R^2$, $R^3$, $R^4$, and $R^5$ are each a hydrogen atom or a methyl group; $L^2$ and $L^4$ are each a $C_{1-10}$ hydroxyalkyl group; $L^5$ is a phenyl group or a benzyl group; and $L^1$ and $L^3$ are each Formula (L1-1) or (L1-2):

Formula (L1-1)

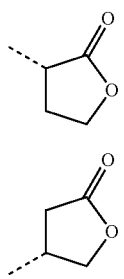

Formula (L1-2)

(where dashed lines are chemical bonds with ester groups of Formula (1-1) and Formula (2-1)), as a sixth aspect, the electron beam resist underlayer film-forming composition as described in any one of the first aspect to the fifth aspect, further comprising a polynuclear phenol, as a seventh aspect, the electron beam resist underlayer film-forming composition as described in any one of the first aspect to the sixth aspect, in which the polynuclear phenol is each compound of Formula (b-1):

Formula (b-1)

$$\left( \underset{(R^{11})_{n1}}{(HO)_{m1}} \!\!\!\bigcirc\!\!\! -R^{12} \right)_q$$

(in Formula (b-1), $R^{11}$ is a substituent group of a hydrogen atom in a benzene ring, and is a hydroxy group, a halogen group, a $C_{1-10}$ alkyl group, a $C_{6-18}$ aryl group, a $C_{7-25}$ arylalkyl group, a $C_{2-10}$ alkylcarbonyl group, a $C_{2-10}$ alkylcarbonyloxy group, a $C_{2-10}$ alkylcarbonylamino group, a $C_{7-10}$ aryloxyalkyl group, a $C_{1-6}$ alkoxy group, or an organic group composed of a combination of these groups; $R^{12}$ is a single bond, a 2 to 4-valent $C_{1-10}$ hydrocarbon group optionally having a substituent of a halogen atom, a 2 to 4-valent $C_{7-25}$ arylalkyl group optionally having a substituent of a halogen atom, or a sulfonyl group; m1 is an integer of 1 to 5; n1 is an integer satisfying and q is an integer of 2 to 4), Formula (b-2):

Formula (b-2)

$$\left( \underset{(R^{13})_{n2}}{(HO)_{m2}} \!\!\!\bigcirc\!\!\! -R^{15}\!\!\!-\!\!\!\bigcirc\!\!\! \underset{(R^{14})_{n3}}{(OH)_{m3}} \right)$$

(in Formula (b-2), $R^{13}$ and $R^{14}$ are each the same as $R^{11}$ in Formula (b-1); $R^{15}$ is a single bond, a 2 to 6-valent $C_{1-10}$ hydrocarbon group optionally having a substituent of a halogen atom, a 2 to 6-valent $C_{7-25}$ arylalkyl group optionally having a substituent of a halogen atom, or a sulfonyl group; m2 and m3 are each an integer of 1 to 5; n2 and n3 are an integer satisfying $0 \leq n2 \leq 5-m2$ and $0 \leq n3 \leq 5-m3$, respectively; and k and s are each an integer of 1 to 3), and Formula (b-3):

Formula (b-3)

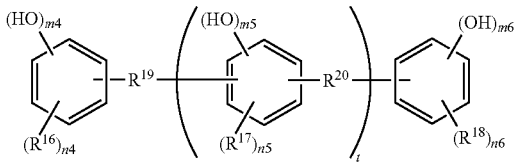

(in Formula (b-3), $R^{16}$, $R^{17}$, and $R^{18}$ are each the same as $R^{11}$ in Formula (b-1); $R^{19}$ and $R^{20}$ are each a single bond, a bivalent $C_{1-10}$ hydrocarbon group optionally having a substituent of a halogen atom, a bivalent $C_{7-25}$ arylalkyl group optionally having a substituent of a halogen atom, or a sulfonyl group; m5 is an integer of 1 to 4; m4 and m6 are each an integer of 1 to 5; n5 is an integer satisfying 0≤n5≤4−m5; n4 and n6 are an integer satisfying 0≤4≤5−m4 and 0≤n6≤5−m6, respectively; and t is an integer of 1 to 4), or a combination of the compounds, as an eighth aspect, the electron beam resist underlayer film-forming composition as described in any one of the first aspect to the seventh aspect, further comprising a crosslinkable compound, as a ninth aspect, the electron beam resist underlayer film-forming composition as described in any one of the first aspect to the eighth aspect, further comprising an acid compound, as a tenth aspect, a method for forming an electron beam resist underlayer film used for a lithography process of semiconductor device production obtained by applying the electron beam resist underlayer film-forming composition as described in any one of the first aspect to the ninth aspect onto a substrate and heating the applied composition, and as an eleventh aspect, a method for producing a semiconductor device comprising: applying the electron beam resist underlayer film-forming composition as described in any one of the first aspect to the ninth aspect onto a substrate and heating the applied composition to form an electron beam resist underlayer film; coating the electron beam resist underlayer film with an electron beam resist; irradiating the substrate coated with the electron beam resist underlayer film and the electron beam resist with an electron beam; developing the substrate; and transferring an image onto the substrate by dry etching to form an integrated circuit element.

Effects of the Invention

The resist underlayer film obtained from the resist underlayer film-forming composition for electron beam lithography of the present invention allows an excellent resist pattern having a straight shape to be formed and enables a sufficient margin to the amount of electron beam irradiation to be obtained by reducing adverse effects caused by a base substrate and electron beams. The resist underlayer film also has a higher dry etching rate than that of the resist film formed as an upper layer on the resist underlayer film and thus a resist pattern can be easily transferred to the base substrate to be processed in a dry etching process.

The underlayer film formed by using the resist underlayer film-forming composition for electron beam lithography of the present invention also has excellent adhesion to the resist film and a base film.

In contrast to a resist underlayer film (antireflective coating) used in a photolithography process for preventing reflection light from the substrate, the resist underlayer film for electron beam lithography of the present invention can form a sharp resist pattern at the time of electron beam irradiation by forming the resist underlayer film under the resist film for electron beam lithography without requiring the effect of preventing reflection light.

MODES FOR CARRYING OUT THE INVENTION

Figure 1:
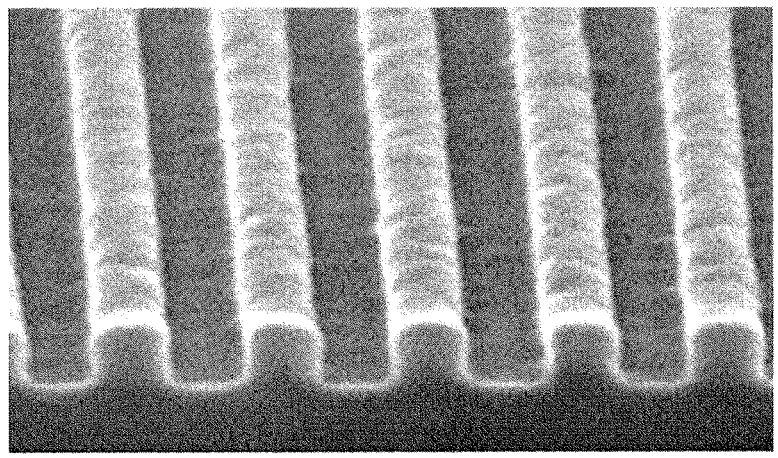
FIG. 1 is an electron microscopic photograph of a resist pattern having a line-and-space of 50 nm obtained in Example 1. The magnification is 150,000 times.

The present invention relates to an electron beam resist underlayer film-forming composition comprising a polymer containing a unit structure having a lactone ring and a unit structure having a hydroxy group.

The electron beam resist underlayer film-forming composition of the present invention basically includes the polymer and a solvent and can contain a polynuclear phenol, a crosslinkable compound, an acid compound as a cross-linking catalyst, and further a surfactant.

The solid content of the electron beam resist underlayer film-forming composition of the present invention is 0.01% by mass to 50% by mass, 0.1% by mass to 20% by mass, or 0.1% by mass to 10% by mass. The solid content is the content of the components of the electron beam resist underlayer film-forming composition from which the solvent component is removed.

Examples of the structure having a lactone ring may include a unit structure having a γ (gamma)-butyrolactone ring, which forms a five-membered ring structure, and a δ (delta)-valerolactone ring, which forms a six-membered ring structure.

Examples of the unit structure having a hydroxy group may preferably include hydroxyalkyl group. Examples of the alkyl group may include linear or branched $C_{1-10}$ alkyl group. For example, linear alkyl groups such as methyl, ethyl, n-propyl, and n-butyl; branched alkyl groups such as i-propyl, i-butyl, and 2-ethylhexyl; and alicyclic alkyl groups such as cyclopentyl and cyclohexyl. Examples of the hydroxyalkyl group may include hydroxymethyl group, hydroxyethyl group, hydroxy-n-propyl group, hydroxy-n-butyl group, hydroxyisopropyl group, hydroxyisobutyl group, hydroxy-2-ethylhexyl group, hydroxycyclopentyl group, and hydroxycyclohexyl group.

In the present invention, the polymer can be a polymer further containing a unit structure having an aryl group or an arylalkyl group. The aryl group is a $C_{6-40}$ aromatic group and examples of the aryl group may include phenyl group, naphthyl group, and anthryl group and may also include heterocyclic aromatic groups such as pyridyl, quinolinyl, and quinoxalinyl group. The arylalkyl group is an organic group formed by bonding the aryl group and examples of the alkyl group, and may include benzyl group and ethylphenyl group.

As the polymer used in the present invention, a polymer obtained by copolymerizing a monomer mixture containing a lactone (meth)acrylate and a hydroxyalkyl (meth)acrylate may be used.

As the polymer used in the present invention, a polymer obtained by copolymerizing a monomer mixture containing a lactone (meth)acrylate, a hydroxyalkyl (meth)acrylate, and phenyl (meth)acrylate or benzyl (meth)acrylate may also be used. Examples of the lactone structure and the hydroxyalkyl structure used here may include the structures described above.

Examples of these copolymers may include a polymer of Formula (1) containing a unit structure of Formula (1-1) and a unit structure of Formula (1-2) or a polymer of Formula (2) containing a unit structure of Formula (2-1), a unit structure of Formula (2-2), and a unit structure of Formula (2-3).

In Formula (1) and Formula (2), $R^1$, $R^2$, $R^3$, $R^4$, and $R^5$ are each a hydrogen atom or a methyl group; $L^2$ and $L^4$ are each a $C_{1-10}$ hydroxyalkyl group; and $L^5$ is a phenyl group or a benzyl group. Examples of the hydroxyalkyl group may include the examples described above.

$L^1$ and $L^3$ are each Formula (L1-1) or (L1-2). In Formula (L1-1) and Formula (L1-2), dashed lines are chemical bonds with ester groups of Formula (1-1) and Formula (2-1).

The molecular weight of the resin varies depending on application solvent used, a solution viscosity, a film shape, and the like and is, as the weight average molecular weight, 1,000 to 1,000,000, preferably 1,000 to 200,000, and further preferably 1,000 to 100,000.

The γ-lactone used in the resin is a lactone having a five-membered ring structure and examples of the γ-lactone may include substituted or unsubstituted γ-lactones such as γ-butyrolactone and γ-valerolactone. The δ-lactone is a lactone having a six-membered ring structure and examples of the δ-lactone may include substituted or unsubstituted δ-lactones such δ-valerolactone and δ-caprolactone.

The unit structure of Formula (1-1) and the unit structure of Formula (2-1) used for the polymers of Formula (1) and Formula (2) can be produced by reacting, for example, an acrylic monomer such as acrylic acid, a halogenated acrylic acid, and methacrylic acid with a lactone such as α-bromo-γ-butyrolactone and α-bromo-δ-valerolactone. The unit structures can also be produced by reacting an acrylic polymer such as acrylic acid, a halogenated acrylic acid, methacrylic acid, or the like with a lactone such as α-bromo-γ-butyrolactone and α-bromo-δ-valerolactone.

Examples of the polymer of Formula (2) used in the invention in this specification may include a copolymer of γ-butyrolactone methacrylate, hydroxyethyl methacrylate, and benzyl methacrylate.

The polymer of Formula (1) can contain the unit structure of Formula (1-1) and the unit structure of Formula (1-2) in a ratio of 5-45:25-60 in mol % in the total unit structures contained in the polymer of Formula (1).

The polymer of Formula (2) can contain the unit structure of Formula (2-1), the unit structure of Formula (2-2) and the unit structure of Formula (2-3) in a ratio of 5-45:25-60:10-45 in mol % in the total unit structures contained in the polymer of Formula (2).

The polymer of Formula (1) or Formula (2) is contained in the solid content in the electron beam resist underlayer film-forming composition in a ratio of 20% by mass or more, for example, 20% by mass to 100% by mass, 30% by mass to 100% by mass, 50% by mass to 99% by mass, 60% by mass to 98% by mass, or 80% by mass to 98% by mass.

The polymer of Formula (1) or Formula (2) may be any one of a random copolymer, a block copolymer, and a graft copolymer. The polymer contained in the electron beam resist underlayer film-forming composition of the present invention can be synthesized by a method such as radical polymerization, anion polymerization, and cation polymerization. As the form of the method, various methods such as solution polymerization, suspension polymerization, emulsion polymerization, and mass polymerization can be used.

In the polymer used in the electron beam resist underlayer film-forming composition of the present invention, a non-crosslinkable monomer can be further copolymerized and whereby a dry etching rate, a reflectance, and the like can be finely adjusted. Examples of such copolymerizable monomers may include the following monomers: for example, a compound having one addition-polymerizable unsaturated bond selected from acrylic acid esters, acrylamides, methacrylic acid esters, methacrylamides, allyl compounds, vinyl ethers, vinyl esters, styrenes, and crotonic acid esters.

Examples of the acrylic acid esters may include alkyl acrylates in which the alkyl group is a $C_{1-10}$ alkyl group.

Examples of the methacrylic acid esters may include alkyl methacrylates in which the alkyl group is a $C_{1-10}$ alkyl group.

Examples of the acrylamides may include acrylamide, N-alkylacrylamides, N-arylacrylamides, N,N-dialkylacrylamides, N,N-diarylacrylamides, N-methyl-N-phenyl acrylamide, and N-2-acetamidoethyl-N-acetylacrylamide.

Examples of the methacrylamides may include methacrylamide, N-alkylmethacrylamides, N-arylmethacrylamides, N,N-dialkylmethacrylamides, N,N-diarylmethacrylamides, N-methyl-N-phenylmethacrylamide, and N-ethyl-N-phenylmethacrylamide.

Examples of the vinyl ethers may include alkyl vinyl ethers and vinyl aryl ethers.

Examples of the vinyl esters may include vinyl butyrate, vinyl isobutyrate, and vinyl trimethylacetate.

Examples of the styrenes may include styrene, alkylstyrenes, alkoxystyrenes, halogenated styrenes, and carboxymethylstyrene.

Examples of the crotonic acid esters may include alkyl crotonates such as butyl crotonate, hexyl crotonate, and glycerin monocrotonate.

Examples of the copolymerizable monomer may also include dialkyl itaconates, dialkyl esters or monoalkyl esters of maleic acid or fumaric acid, crotonic acid, itaconic acid, maleic anhydride, acrylonitrile, methacrylonitrile, and maleylonitrile.

The electron beam resist underlayer film-forming composition of the present invention can contain a polynuclear phenol. The amount of the polynuclear phenol to be added varies depending on an application solvent used, a base substrate used, a required solution viscosity, a required film shape, and the like. The amount is 0.001% by mass to 40% by mass, 0.01% by mass to 30% by mass, 0.1% by mass to 25% by mass, or 0.1% by mass to 10% by mass relative to the solid content. Although the polynuclear phenol may cause a crosslinking reaction due to self-condensation, the polynuclear phenol can cause a crosslinking reaction to crosslinkable functional groups (for example, hydroxy groups) in the polymer of Formula (1) or Formula (2).

The polynuclear phenol used in the present invention is a compound having 2 to 30 phenolic hydroxy groups in a molecule. Alternatively, the polynuclear phenol is a compound having 2 to 10 phenol groups in a molecule. The polynuclear phenol used in the present invention has a phenol group and the phenol group has at least one phenolic hydroxy group. The polynuclear phenol used in the present invention can be constituted by a part having phenol groups or can be constituted by a combination of a part having phenol groups and a part other than phenol groups.

The compounds of Formulae (b-1), (b-2), and (b-3) or a combination thereof are used as the polynuclear phenol.

In Formula (b-1), $R^{11}$ is a substituent group of a hydrogen atom in a benzene ring, and a hydroxy group, a halogen group, a $C_{1-10}$ alkyl group, a $C_{6-18}$ aryl group, a $C_{7-25}$ arylalkyl group, a $C_{2-10}$ alkylcarbonyl group, a $C_{2-10}$ alkylcarbonyloxy group, a $C_{2-10}$ alkylcarbonylamino group, a $C_{7-10}$ aryloxyalkyl group, a $C_{1-6}$ alkoxy group, or an organic group composed of a combination of these groups; $R^{12}$ is a single bond, a 2 to 4-valent $C_{1-10}$ hydrocarbon group optionally having a substituent of a halogen atom, a 2 to 4-valent $C_{7-25}$ arylalkyl group optionally having a substituent of a halogen atom, or a sulfonyl group; m1 is an integer of 1 to 5; n1 is an integer satisfying 0≤n1≤5−m1; and q is an integer of 2 to 4.

Examples of the halogen atom may include a fluorine atom, a chlorine atom, a bromine atom, and an iodine atom and examples of the halogen group may include fluorine group, chlorine group, bromine group, and iodine group.

Examples of the alkyl group may include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group. Particularly preferable examples of the alkyl group may include linear alkyl groups such as methyl group and ethyl group, and cyclohexyl groups.

The hydrocarbon group used for $R^{12}$, $R^{15}$, $R^{19}$, and $R^{29}$ is an organic group that is the bivalent, 2 to 4-valent or 2 to 6-valent alkyl group.

Examples of the aryl group may include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

Examples of the arylalkyl group may include benzyl group, o-methylbenzyl group, m-methylbenzyl group, p-methylbenzyl group, o-chlorobenzyl group, m-chlorobenzyl group, p-chlorobenzyl group, o-fluorobenzyl group, p-fluorobenzyl group, o-methoxybenzyl group, p-methoxybenzyl group, p-nitrobenzyl group, p-cyanobenzyl group, phenethyl group, o-methylphenethyl group, m-methylphenethyl group, p-methylphenethyl group, o-chlorophenethyl group, m-chlorophenethyl group, p-chlorophenethyl group, o-fluorophenethyl group, p-fluorophenethyl group, o-methoxyphenethyl group, p-methoxyphenethyl group, p-nitrophenethyl group, p-cyanophenethyl group, 3-phenylpropyl group, 4-phenylbutyl group, 5-phenylpentyl group, 6-phenylhexyl group, α-naphthylmethyl group, β-naphthylmethyl group, o-biphenylylmethyl group, m-biphenylylmethyl group, p-biphenylylmethyl group, 1-anthrylmethyl group, 2-anthrylmethyl group, 9-anthrylmethyl group, 1-phenanthrylmethyl group, 2-phenanthrylmethyl group, 3-phenanthrylmethyl group, 4-phenanthrylmethyl group, a 9-phenanthrylmethyl group, α-naphthylethyl group, β-naphthylethyl group, o-biphenylylethyl group, m-biphenylylethyl group, p-biphenylylethyl group, 1-anthrylethyl group, 2-anthrylethyl group, 9-anthrylethyl group, 1-phenanthrylethyl group, 2-phenanthrylethyl group, 3-phenanthrylethyl group, 4-phenanthrylethyl group, and 9-phenanthrylethyl group.

The arylalkyl group used for $R^{12}$, $R^{15}$, $R^{19}$, and $R^{29}$ is an organic group that is the bivalent, 2 to 4-valent or 2 to 6-valent arylalkyl group.

Examples of the alkylcarbonyl group may include methylcarbonyl group, ethylcarbonyl group, n-propylcarbonyl group, i-propylcarbonyl group, cyclopropylcarbonyl group, n-butylcarbonyl group, i-butylcarbonyl group, s-butylcarbonyl group, t-butylcarbonyl group, cyclobutylcarbonyl group, 1-methyl-cyclopropylcarbonyl group, 2-methyl-cyclopropylcarbonyl group, n-pentylcarbonyl group, 1-methyl-n-butylcarbonyl group, 2-methyl-n-butylcarbonyl group, 3-methyl-n-butylcarbonyl group, 1,1-dimethyl-n-propylcarbonyl group, 1,2-dimethyl-n-propylcarbonyl group, 2,2-dimethyl-n-propylcarbonyl group, 1-ethyl-n-propylcarbonyl group, cyclopentylcarbonyl group, 1-methyl-cyclobutylcarbonyl group, 2-methyl-cyclobutylcarbonyl group, 3-methyl-cyclobutylcarbonyl group, 1,2-dimethyl-cyclopropylcarbonyl group, 2,3-dimethyl-cyclopropylcarbonyl group, 1-ethyl-cyclopropylcarbonyl group, 2-ethyl-cyclopropylcarbonyl group, n-hexylcarbonyl group, 1-methyl-n-pentylcarbonyl group, 2-methyl-n-pentylcarbonyl group, 3-methyl-n-pentylcarbonyl group, 4-methyl-n-pentylcarbonyl group, 1,1-dimethyl-n-butylcarbonyl group, 1,2-dimethyl-n-butylcarbonyl group, 1,3-dimethyl-n-butylcarbonyl group, 2,2-dimethyl-n-butylcarbonyl group, 2,3-dimethyl-n-butylcarbonyl group, 3,3-dimethyl-n-butylcarbonyl group, 1-ethyl-n-butylcarbonyl group, 2-ethyl-n-butylcarbonyl group, 1,1,2-trimethyl-n-propylcarbonyl group, 1,2,2-trimethyl-n-propylcarbonyl group, 1-ethyl-1-methyl-n-propylcarbonyl group, 1-ethyl-2-methyl-n-propylcarbonyl group, cyclohexylcarbonyl group, 1-methyl-cyclopentylcarbonyl group, 2-methyl-cyclopentylcarbonyl group, 3-methyl-cyclopentylcarbonyl group, 1-ethyl-cyclobutylcarbonyl group, 2-ethyl-cyclobutylcarbonyl group, 3-ethyl-cyclobutylcarbonyl group, 1,2-dimethyl-cyclobutylcarbonyl group, 1,3-dimethyl-cyclobutylcarbonyl group, 2,2-dimethyl-cyclobutylcarbonyl group, 2,3-dimethyl-cyclobutylcarbonyl group, 2,4-dimethyl-cyclobutylcarbonyl group, 3,3-dimethyl-cyclobutylcarbonyl group, 1-n-propyl-cyclopropylcarbonyl group, 2-n-propyl-cyclopropylcarbonyl group, 1-i-propyl-cyclopropylcarbonyl group, 2-i-propyl-cyclopropylcarbonyl group, 1,2,2-trimethyl-cyclopropylcarbonyl group, 1,2,3-trimethyl-cyclopropylcarbonyl group, 2,2,3-trimethyl-cyclopropylcarbonyl group, 1-ethyl-2-methyl-cyclopropylcarbonyl group, 2-ethyl-1-methyl-cyclopropylcarbonyl group, 2-ethyl-2-methyl-cyclopropylcarbonyl group, and 2-ethyl-3-methyl-cyclopropylcarbonyl group.

Examples of the alkylcarbonyloxy group may include methylcarbonyloxy group, ethylcarbonyloxy group, n-propylcarbonyloxy group, i-propylcarbonyloxy group, cyclopropylcarbonyloxy group, n-butylcarbonyloxy group, i-butylcarbonyloxy group, s-butylcarbonyloxy group, t-butylcarbonyloxy group, cyclobutylcarbonyloxy group, 1-methyl-cyclopropylcarbonyloxy group, 2-methyl-cyclopropylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, cyclopentylcarbonyloxy group, 1-methyl-cyclobutylcarbonyloxy group, 2-methyl-cyclobutylcarbonyloxy group, 3-methyl-cyclobutylcarbonyloxy group, 1,2-dimethyl-cyclopropylcarbonyloxy group, 2,3-dimethyl-cyclopropylcarbonyloxy group, 1-ethyl-cyclopropylcarbonyloxy group, 2-ethyl-cyclopropylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, cyclohexylcarbonyloxy group, 1-methyl-cyclopentylcarbonyloxy group, 2-methyl-cyclopentylcarbonyloxy group, 3-methyl-cyclopentylcarbonyloxy group, 1-ethyl-cyclobutylcarbonyloxy group, 2-ethyl-cyclobutylcarbonyloxy group, 3-ethyl-cyclobutylcarbonyloxy group, 1,2-dimethyl-cyclobutylcarbonyloxy group, 1,3-dimethyl-cyclobutylcarbonyloxy group, 2,2-dimethyl-cyclobutylcarbonyloxy group, 2,3-dimethyl-cyclobutylcarbonyloxy group, 2,4-dimethyl-cyclobutylcarbonyloxy group, 3,3-dimethyl-cyclobutylcarbonyloxy group, 1-n-propyl-cyclopropylcarbonyloxy group, 2-n-propyl-cyclopropylcarbonyloxy group, 1-i-propyl-cyclopropylcarbonyloxy group, 2-i-propyl-cyclopropylcarbonyloxy group, 1,2,2-trimethyl-cyclopropylcarbonyloxy group, 1,2,3-trimethyl-cyclopropylcarbonyloxy group, 2,2,3-trimethyl-cyclopropylcarbonyloxy group, 1-ethyl-2-methyl-cyclopropylcarbonyloxy group, 2-ethyl-1-methyl-cyclopropylcarbonyloxy group, 2-ethyl-2-methyl-cyclopropylcarbonyloxy group, and 2-ethyl-3-methyl-cyclopropylcarbonyloxy group.

Examples of the alkylcarbonylamino group may include methylcarbonylamino group, ethylcarbonylamino group, n-propylcarbonylamino group, i-propylcarbonyl group, cyclopropylcarbonylamino group, n-butylcarbonylamino group, i-butylcarbonylamino group, s-butylcarbonylamino group, t-butylcarbonylamino group, cyclobutylcarbonylamino group, 1-methyl-cyclopropylcarbonylamino group, 2-methyl-cyclopropylcarbonylamino group, n-pentylcarbonylamino group, 1-methyl-n-butylcarbonylamino group, 2-methyl-n-butylcarbonylamino group, 3-methyl-n-butylcarbonylamino group, 1,1-dimethyl-n-propylcarbonylamino group, and 1,2-dimethyl-n-propylcarbonylamino group.

Examples of the aryloxyalkyl group may include phenyloxymethyl group, o-methylphenyloxyethyl group, m-methylphenyloxymethyl group, p-methylphenyloxypropyl group, o-chlorophenyloxymethyl group, m-chlorophenyloxyethyl group, p-chlorophenyloxyisopropyl group, o-fluorophenyloxyethyl group, p-fluorophenyloxybutoxy group, o-methoxyphenyloxy-n-pentyl group, p-methoxyphenyloxy-t-butyl group, p-nitrophenyloxymethyl group, p-cyanophenyloxy-s-butyl group, α-naphthyloxymethyl group, 3-naphthyloxyethyl group, o-biphenylyloxymethyl group, m-biphenylyloxymethyl group, p-biphenylyloxymethyl group, 1-anthryloxymethyl group, 2-anthryloxymethyl group, 9-anthryloxymethyl group, 1-phenanthryloxymethyl group, a 2-phenanthryloxymethyl group, 3-phenanthryloxymethyl group, 4-phenanthryloxymethyl group, and 9-phenanthryloxymethyl group.

Examples of the alkoxy group may include methoxy group, ethoxy group, n-propoxy group, i-propoxy group, n-butoxy group, i-butoxy group, s-butoxy group, t-butoxy group, n-pentoxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, a 1,2-dimethyl-n-butoxy group, a 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group.

The following compounds are exemplified as the compound of Formula (b-1).

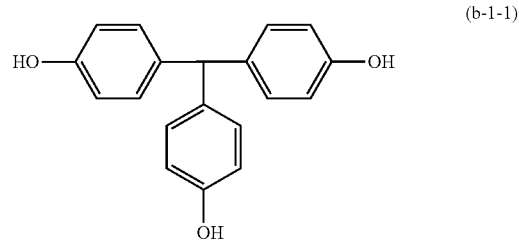

(b-1-1)

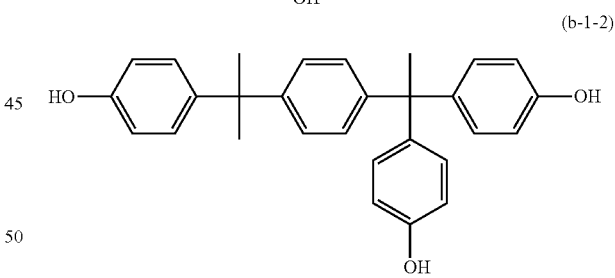

(b-1-2)

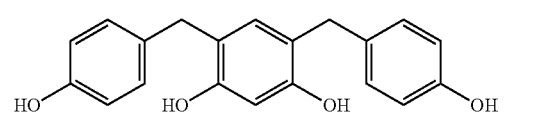

(b-1-3)

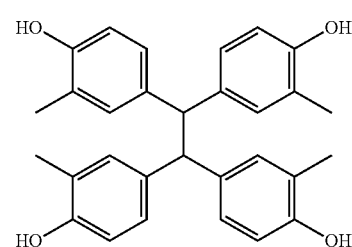

(b-1-4)

(b-1-5)
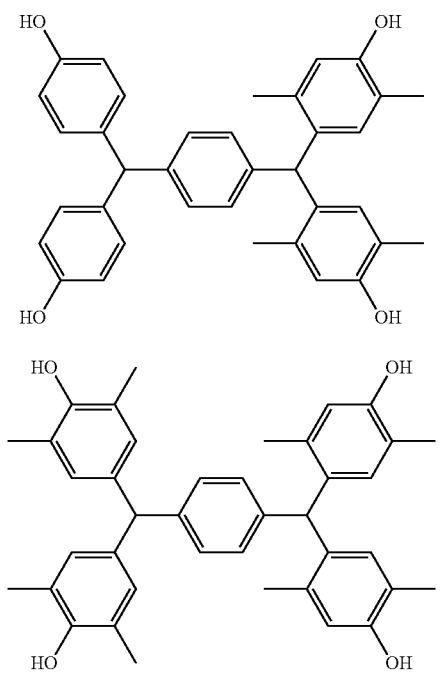
(b-1-6)
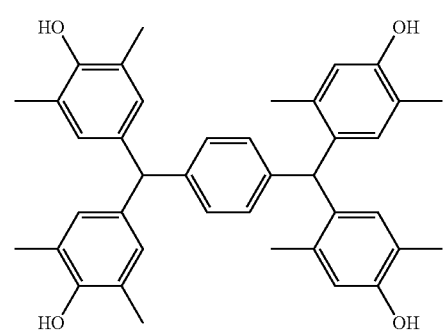
(b-1-7)
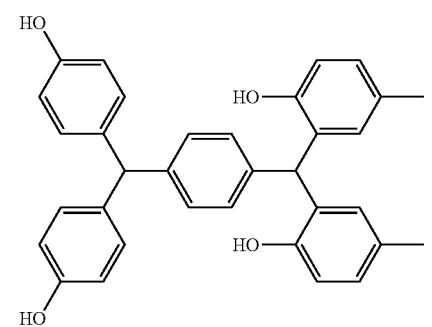
(b-1-8)
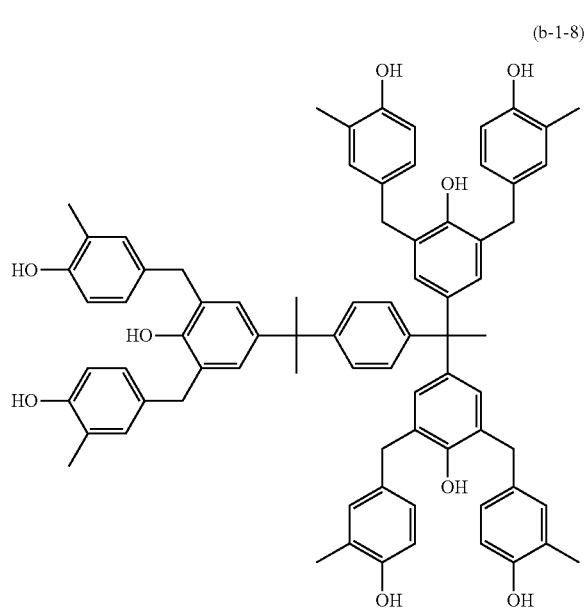
(b-1-9)
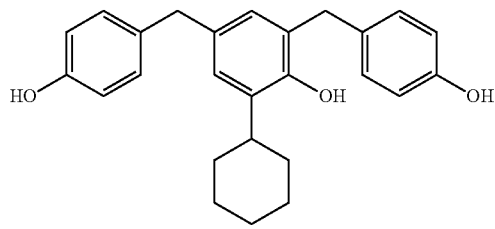
(b-1-10)
(b-1-11)
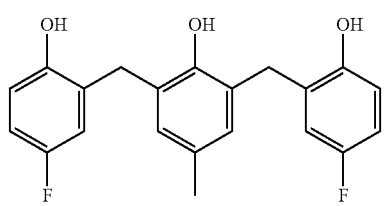
(b-1-12)
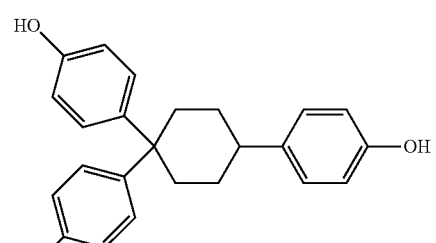
(b-1-13)
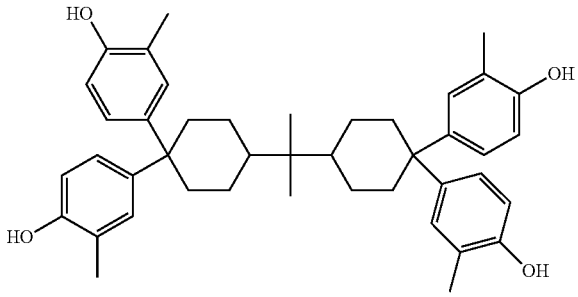
(b-1-14)
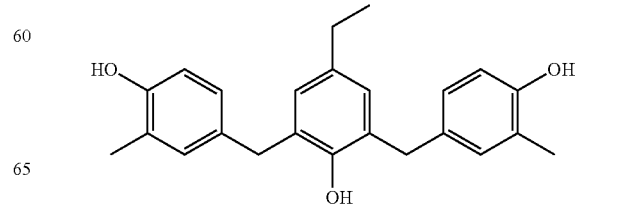

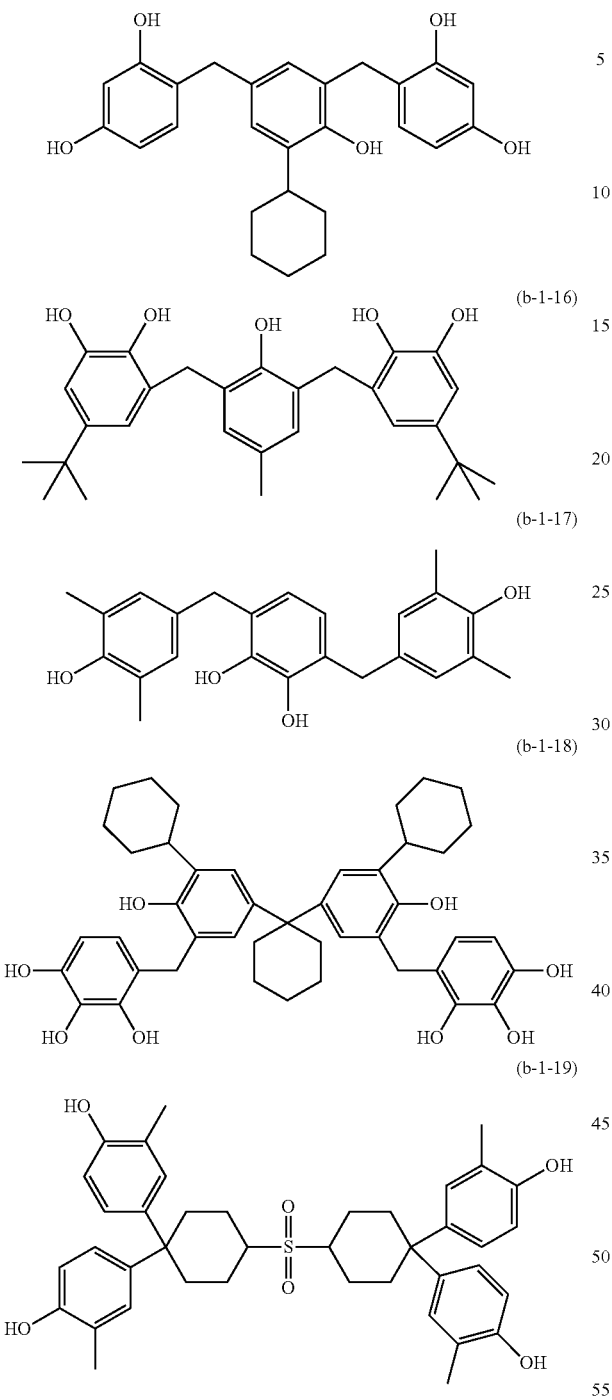

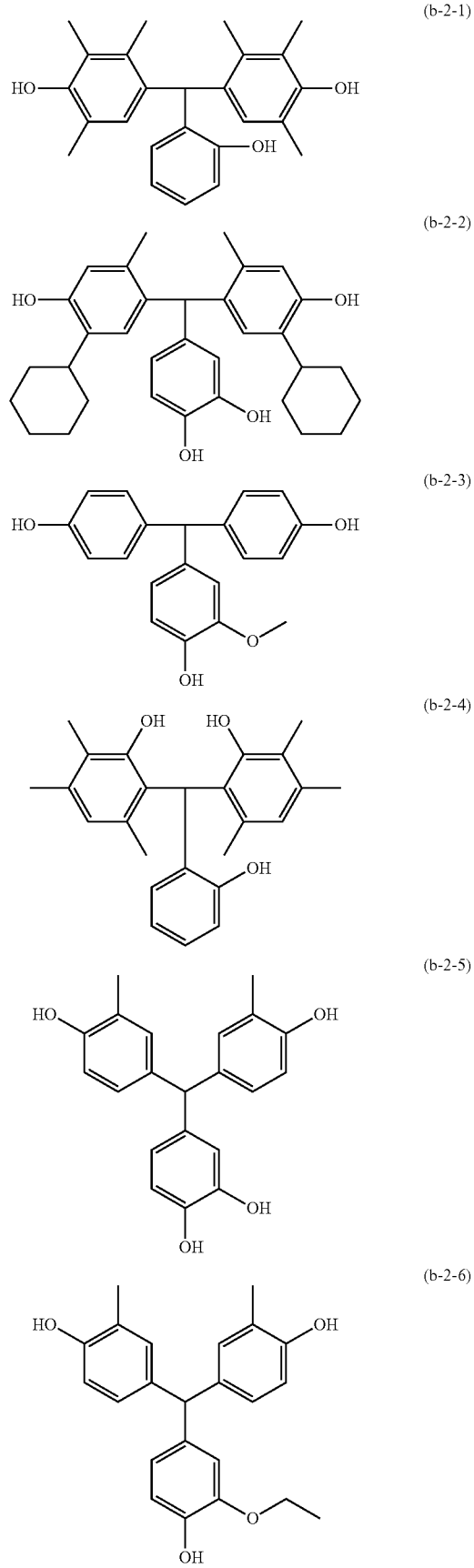

In Formula (b-2), $R^{13}$ and $R^{14}$ are each the same as $R^{11}$ in Formula (b-1); $R^{15}$ is a single bond, a 2 to 6-valent $C_{1-10}$ hydrocarbon group optionally having a substituent of a halogen atom, a 2 to 6-valent $C_{7-25}$ arylalkyl group optionally having a substituent of a halogen atom, or a sulfonyl group; m2 and m3 are each an integer of 1 to 5; n2 and n3 are an integer satisfying 0≤n2≤5−m2 and 0≤n3≤5−m3, respectively; and k and s are each an integer of 1 to 3.

The following compounds are exemplified as the compound of Formula (b-2).

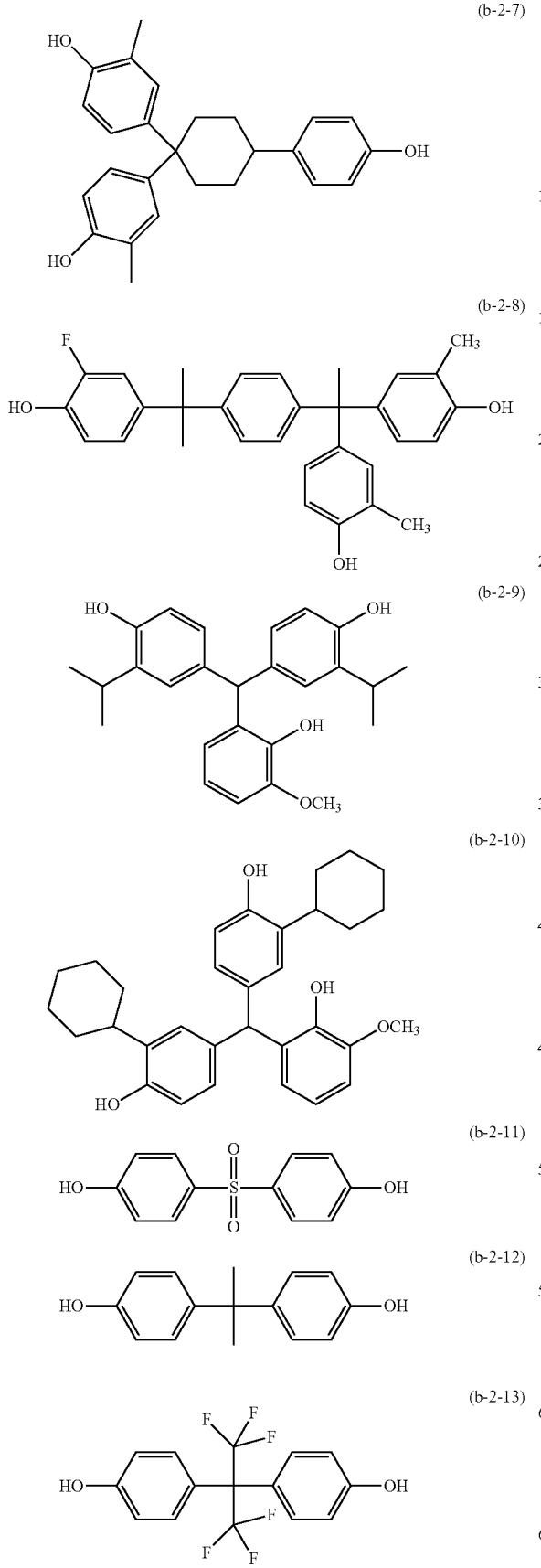
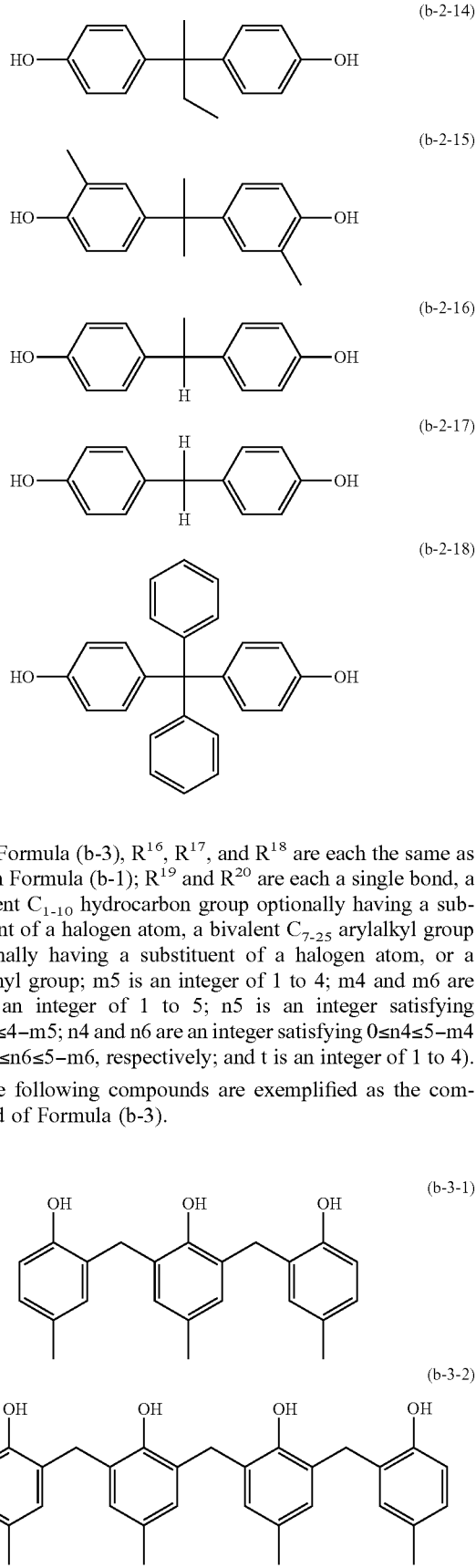

In Formula (b-3), $R^{16}$, $R^{17}$, and $R^{18}$ are each the same as $R^{11}$ in Formula (b-1); $R^{19}$ and $R^{20}$ are each a single bond, a bivalent $C_{1-10}$ hydrocarbon group optionally having a substituent of a halogen atom, a bivalent $C_{7-25}$ arylalkyl group optionally having a substituent of a halogen atom, or a sulfonyl group; m5 is an integer of 1 to 4; m4 and m6 are each an integer of 1 to 5; n5 is an integer satisfying $0 \le n5 \le 4-m5$; n4 and n6 are an integer satisfying $0 \le n4 \le 5-m4$ and $0 \le n6 \le 5-m6$, respectively; and t is an integer of 1 to 4).

The following compounds are exemplified as the compound of Formula (b-3).

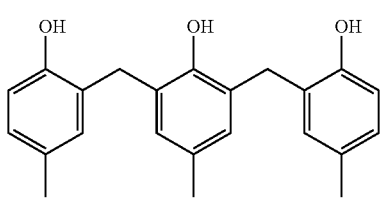
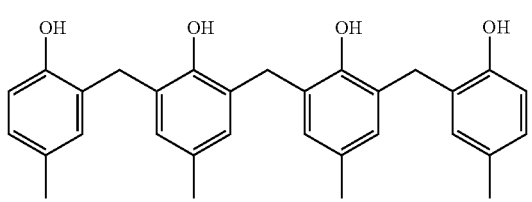

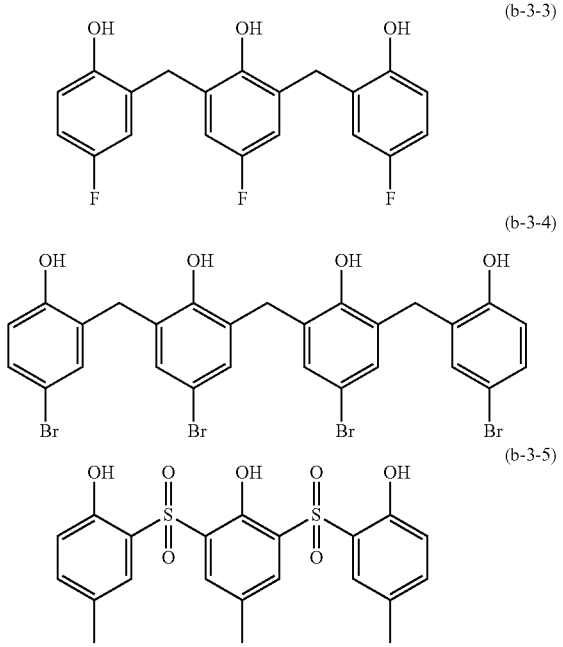

The following cyclic compounds can also be used as the polynuclear phenol.

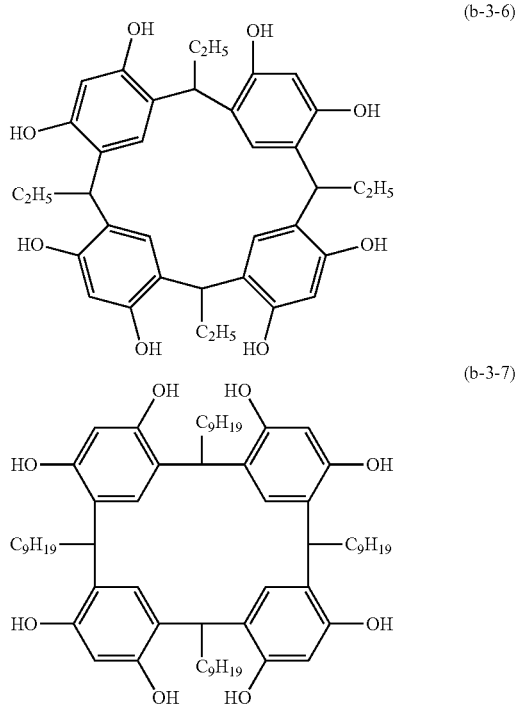

The polynuclear phenol used in the invention in this specification is preferably the compounds of Formula (b-2) and, for example, bisphenol S of (b-2-11) can be preferably used.

The electron beam resist underlayer film-forming composition of the present invention is preferably crosslinked by heating after application to prevent intermixing with the electron beam resist applied onto the electron beam resist underlayer film and the electron beam resist underlayer film-forming composition of the present invention thus can further contain a crosslinking agent component. Examples of the crosslinking agent may include a melamine-based compound having a crosslink-forming substituent such as methylol group or methoxymethyl group, a substituted urea compound, and a macromolecular compound having epoxy groups. The crosslinking agent is preferably a crosslinking agent having at least two crosslink-forming substituents, for example, a compound such as methoxymethylated glycouril or methoxymethylated melamine. Particularly preferable examples of the crosslinking agent include tetramethoxymethylglycoluril or hexamethoxymethylolmelamine. The amount of the crosslinking agent to be added varies depending on an application solvent used, a base substrate used, a required solution viscosity, a required film shape, and the like. The amount is 0.001% by mass to 40% by mass, 0.01% by mass to 30% by mass, 0.1% by mass to 25% by mass, or 1% by mass to 10% by mass relative to the solid content. Although these crosslinking agents may cause a crosslink reaction due to self-condensation, the crosslinking agent can cause a crosslinking reaction with crosslink-forming substituents when the crosslink-forming substituents exist in the polymer used in the resist underlayer film-forming composition of the present invention.

The electron beam resist underlayer film-forming composition of the present invention can contain an acid compound as a catalyst for promoting the crosslinking reaction. As the acid compound, acidic compounds such as p-toluenesulfonic acid, trifluoromethanesulfonic acid, pyridinium p-toluenesulfonate, salicylic acid, sulfosalicylic acid, citric acid, benzoic acid, and hydroxybenzoic acid, and/or thermal acid generators such as 2,4,4,6-tetrabromocyclohexadienone, benzoin tosylate, and 2-nitrobenzyl tosylate can be added. The amount of the acid compound to be added is 0.02% by mass to 10% by mass, and preferably 0.04% by mass to 5% by mass per solid content.

In order to match the acidity of the resist underlayer film-forming composition for electron beam lithography of the present invention to the acidity of the resist that covers the resist underlayer film in the lithography process as an upper layer, the resist underlayer film-forming composition for electron beam lithography of the present invention can contain an acid generator generating an acid by irradiation with electron beams. Examples of the preferable acid generator may include an onium salt-based acid generators such as bis(4-tert-butylphenyl)iodonium trifluoromethanesulfonate and triphenylsulfonium trifluoromethanesulfonate; halogen-containing acid-based generators such as phenylbis(trichloromethyl)-s-triazine; and sulfonic acid-based acid generators such as benzoin tosylate and N-hydroxysuccinimide trifluoromethanesulfonate. The amount of the acid generator to be added is 0.02% by mass to 3% by mass and preferably 0.04% by mass to 2% by mass per solid content.

Examples of a solvent for dissolving the polymer and the like to prepare the electron beam resist underlayer film-forming composition may include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents can be used singly or in combination of two or more of them.

In addition, these solvents can be used by mixing with a high boiling point solvent such as propylene glycol monobutyl ether and propylene glycol monobutyl ether acetate. Among these solvents, propylene glycol monomethyl ether, propylene glycol monomethyl ether acetate, ethyl lactate, butyl lactate, and cyclohexanone are preferable for improving a levering property.

To the electron beam resist underlayer film-forming composition of the present invention, for example, a rheology modifier, an adhesion assistance agent, or a surfactant can be further added in addition to the components described above if necessary.

The rheology modifier is added for the purpose of mainly improving flowability of the electron beam resist underlayer film-forming composition, and, particularly in a heating (baking) process, enhancing filling ability of the electron beam resist underlayer film-forming composition into inside of a hole of a substrate. Specific examples of the rheology modifier may include phthalic acid derivatives such as dimethyl phthalate, diethyl phthalate, diisobutyl phthalate, dihexyl phthalate, and butylisodecyl phthalate; adipic acid derivatives such as di-n-butyl adipate, diisobutyl adipate, diisooctyl adipate, and octyldecyl adipate; maleic acid derivatives such as di-n-butylmaleate, diethyl maleate, and dinonyl maleate; oleic acid derivatives such as methyl oleate, butyl oleate, and tetrahydrofurfuryl oleate; and stearic acid derivatives such as n-butyl stearate, and glyceryl stearate. These rheology modifiers are usually added in a ratio of less than 30% by mass relative to the whole composition of the electron beam resist underlayer film-forming composition for lithography.

The adhesion assistance agent is mainly added for improving adhesion between the substrate or the electron beam resist and the electron beam resist underlayer film and for preventing the resist from being peeled, particularly in development. Specific examples of the adhesion assistance agent may include chlorosilanes such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis(trimethylsilyl)urea, dimethyltrimethylsilylamine, and trimethylsilylimidazole; silanes such as vinyltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; and urea compounds or thiourea compounds such as 1,1-dimethylurea and 1,3-dimethylurea. These adhesion assistance agents are usually added in a ratio of less than 5% by mass, and preferably in a ratio of less than 2% by mass relative to the whole composition of the electron beam resist underlayer film-forming composition.

To the electron beam resist underlayer film-forming composition of the present invention, a surfactant can be added for preventing occurrence of pinholes and striations and further improving coating properties to surface unevenness. Examples of the surfactant may include nonionic surfactants such as polyoxyethylene alkyl ethers including polyoxyethylene lauryl ethers, polyoxyethylene stearyl ethers, polyoxyethylene cetyl ethers, and polyoxyethylene oleyl ethers; polyoxyethylene alkylallyl ethers including polyoxyethylene octylphenol ethers and polyoxyethylene nonylphenol ethers; polyoxyethylene-polyoxypropylene block copolymers; sorbitan fatty acid esters including sorbitan monolaurate, sorbitan monopalmitate, sorbitan monostearate, sorbitan monooleate, sorbitan trioleate, and sorbitan tristearate; and polyoxyethylene sorbitan fatty acid esters including polyoxyethylene sorbitan monolaurates, polyoxyethylene sorbitan monopalmitates, polyoxyethylene sorbitan monostearates, polyoxyethylene sorbitan trioleates, and polyoxyethylene sorbitan tristearates; fluorochemical surfactants such as EFTOP EF301, EF303, and EF352 (manufactured by Tochem Products), MEGAFACE F171, and F173 (manufactured by Dainippon Ink and Chemicals Inc.), Fluorad FC430 and FC431 (manufactured by Sumitomo 3M Ltd.), Asahi guard AG710, Surflon S-382, SC101, SC102, SC103, SC104, SC105, and SC106 (manufactured by Asahi Glass Co., Ltd.); and Organosiloxane Polymer KP341 (manufactured by Shin-Etsu Chemical Co., Ltd.). The amount of the surfactant to be added is usually 0.2% by mass or less and preferably 0.1% by mass or less relative to the whole composition of the present invention. These surfactants can be added singly or in combination of two or more of them.

As the electron beam resist applied on the resist underlayer film for electron beam of the present invention, both a negative resist and a positive resist can be used. Examples of the resist include a chemically amplified resist made of an acid generator and a binder having a group that changes an alkali dissolution rate by decomposing with an acid; a chemically amplified resist made of an alkali-soluble binder, an acid generator, and a low molecular weight compound that changes an alkali dissolution rate of the resist by decomposing with an acid; a chemically amplified resist made of an acid generator, a binder having a group that changes an alkali dissolution rate by decomposing with an acid, and a low molecular weight compound that changes an alkali dissolution rate of the resist by decomposing with an acid; a non-chemically amplified resist made of a binder having a group that changes an alkali dissolution rate by decomposing with electron beams; and a non-chemically amplified resist made of a binder having a moiety that is cut by electron beams to change an alkali dissolution rate.

As the development liquid for the positive resist having the resist underlayer film formed by using the electron beam resist underlayer film-forming composition of the present invention, the following aqueous alkali solutions can be used. The aqueous alkali solutions include solutions of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcoholamines such as dimethylethanolamine and triethanolamine; quaternary ammonium salts such as tetramethylammonium hydroxide, tetraethylammonium hydroxide, and choline; and cyclic amines such as pyrrole and piperidine. To the aqueous solutions of the alkalis described above, an adequate amount of alcohols such as isopropyl alcohol or a surfactant such as a nonionic surfactant can be added and the mixture can be used. Among these development liquids, the quaternary ammonium salts are preferable and tetramethylammonium hydroxide and choline are further preferable.

The applied film is formed by applying the electron beam resist underlayer film-forming composition of the present invention onto a semiconductor substrate (for example, a silicon/silicon dioxide coated substrate, a silicon wafer substrate, a silicon nitride substrate, a glass substrate, an ITO substrate, a polyimide substrate, and a low dielectric constant material (low-k material) coated substrate) for use in producing a semiconductor device by an appropriate coating method such as a spinner and a coater.

In the present invention, the resist underlayer film for electron beam lithography is formed by applying the electron beam resist underlayer film-forming composition onto the substrate and heating the applied composition.

The film thickness of the electron beam resist underlayer film formed from the electron beam resist underlayer film-forming composition of the present invention is, for example, 1 nm to 2,000 nm, 1 nm to 100 nm, 1 nm to 20 nm, or 5 nm to 15 nm on the surface of the substrate.

Conditions for heating after the application are 80° C. to 350° C. for 0.5 minutes to 120 minutes. Thereafter, the electron beam resist is directly applied onto the resist underlayer film or applied after forming a film made of one to several layers of coating material on the underlayer film if necessary. Thereafter, the resist is irradiated with electron beams through the predetermined mask and is developed, rinsed, and dried to be able to obtain an excellent resist pattern. Post Exposure Bake (PEB) of electron beams can also be carried out if necessary. The part of the electron beam resist underlayer film from which the electron beam resist is removed by the previous process is removed by dry etching to be able to form a desired pattern on the substrate.

The electron beam irradiation to the electron beam resist can be carried out by, for example, using an electron beam irradiation device.

In the present invention, the semiconductor device is produced by applying the electron beam resist underlayer film-forming composition onto a substrate having a processing target film to which a transfer pattern is formed and heating the applied composition to form an electron beam resist underlayer film; coating the electron beam resist underlayer film with an electron beam resist; irradiating the substrate coated with the electron beam resist underlayer film and the electron beam resist with electron beams; developing the substrate; and transferring an image onto the substrate by dry etching to produce an integrated circuit element.

In the semiconductor device to which the electron beam resist underlayer film-forming composition of the present invention is applied, the processing target film (processing target substrate) to which a pattern is to be transferred, the resist underlayer film, and the resist are formed in this order on the substrate. This resist underlayer film allows an excellent resist pattern having a straight shape to be firmed and enables a sufficient margin to the amount of electron beam irradiation to be obtained by reducing adverse effects caused by a base substrate and electron beams. The resist underlayer film also has a higher dry etching rate than that of the resist film formed as an upper layer on the resist underlayer film and thus a resist pattern can be easily transferred to the base film to be processed in a dry etching process.

EXAMPLES

Synthesis Example 1

10 g (0.057 mol) of benzyl methacrylate, 19.2 g (0.133 mol) of hydroxypropyl methacrylate, and 10.8 g (0.063 mol) of γ-butyrolactone methacrylate were dissolved into 128 g of propylene glycol monomethyl ether, and thereafter the inside of the flask was purged with nitrogen and the mixture was heated to 80° C.

Thereafter, 1.6 g of methyl 2,2'-azobisisobutyrate was dissolved into 30.4 g of propylene glycol monomethyl ether and the solution was added to the mixture under pressurized nitrogen. The resultant mixture was reacted at 80° C. for 24 hours to obtain a polymer. The weight average molecular weight Mw of the obtained polymer (resin) in terms of polystyrene was 10,000.

Synthesis Example 2

10 g (0.057 mol) of benzyl methacrylate, 19.2 g (0.133 mol) of hydroxypropyl methacrylate, and 10.8 g (0.063 mol) of γ-butyrolactone methacrylate were dissolved into 120 g of propylene glycol monomethyl ether, and thereafter the inside of the flask was purged with nitrogen and the mixture was heated to 60° C.

Thereafter, 0.4 g of 2,2'-azobisisobutyronitrile was dissolved into 39.6 g of propylene glycol monomethyl ether and the solution was added to the mixture under pressurized nitrogen. The resultant mixture was reacted at 60° C. for 24 hours to obtain a polymer. The weight average molecular weight Mw of the obtained polymer (resin) in terms of polystyrene was 87,000.

Synthesis Example 3

10 g (0.057 mol) of benzyl methacrylate, 10 g (0.069 mol) of hydroxypropyl methacrylate, and 10.3 g (0.061 mol) of γ-butyrolactone methacrylate were dissolved into 84.848 g of ethyl lactate, and thereafter the inside of the flask was purged with nitrogen and the mixture was heated to 70° C.

Thereafter, 0.364 g of 2,2'-azobisisobutyronitrile was dissolved into 36 g of ethyl lactate and the solution was added to the mixture under pressurized nitrogen. The resultant mixture was reacted at 70° C. for 24 hours to obtain a polymer. The weight average molecular weight Mw of the obtained polymer (resin) in terms of polystyrene was 22,000.

Synthesis Example 4

10 g (0.057 mol) of benzyl methacrylate, 10 g (0.069 mol) of hydroxypropyl methacrylate, and 10.3 g (0.061 mol) of γ-butyrolactone methacrylate were dissolved into 90.909 g of ethyl lactate, and thereafter the inside of the flask was purged with nitrogen and the mixture was heated to 70° C.

Thereafter, 0.909 g of 2,2'-azobisisobutyronitrile was dissolved into 29.394 g of ethyl lactate and the solution was added to the mixture under pressurized nitrogen. The resultant mixture was reacted at 70° C. for 24 hours to obtain a polymer. The weight average molecular weight Mw of the obtained polymer (resin) in terms of polystyrene was 12,000.

Synthesis Example 5

10 g (0.057 mol) of benzyl methacrylate, 19.2 g (0.133 mol) of hydroxypropyl methacrylate, and 10.8 g (0.063 mol) of γ-butyrolactone methacrylate were dissolved into 120 g of ethyl lactate, and thereafter the inside of the flask was purged with nitrogen and the mixture was heated to 60° C.

Thereafter, 0.4 g of 2,2'-azobisisobutyronitrile was dissolved into 39.6 g of ethyl lactate and the solution was added to the mixture under pressurized nitrogen. The resultant mixture was reacted at 60° C. for 24 hours to obtain a polymer. The weight average molecular weight Mw of the obtained polymer (resin) in terms of polystyrene was 82,000.

Synthesis Example 6

10 g (0.057 mol) of benzyl methacrylate, 27.778 g (0.193 mol) of hydroxypropyl methacrylate, and 17.778 g (0.104 mol) of γ-butyrolactone methacrylate were dissolved into 155.556 g of ethyl lactate, and thereafter the inside of the flask was purged with nitrogen and the mixture was heated to 70° C.
Thereafter, 0.667 g of 2,2'-azobisisobutyronitrile was dissolved into 66 g of ethyl lactate and the solution was added to the mixture under pressurized nitrogen. The resultant mixture was reacted at 70° C. for 24 hours to obtain a polymer. The weight average molecular weight Mw of the obtained polymer (resin) in terms of polystyrene was 25,000.

Comparative Synthesis Example 1

10 g (0.057 mol) of benzyl methacrylate and 19.2 g (0.133 mol) of hydroxypropyl methacrylate were dissolved into 128 g of propylene glycol monomethyl ether, and thereafter the inside of the flask was purged with nitrogen and the mixture was heated to 80° C.
Thereafter, 1.6 g of methyl 2,2'-azobisisobutyrate was dissolved into 30.4 g of propylene glycol monomethyl ether and the solution was added to the mixture under pressurized nitrogen. The resultant mixture was reacted at 80° C. for 24 hours to obtain a polymer. The weight average molecular weight Mw of the obtained polymer (resin) in terms of polystyrene was 20,000.

Example 1

Figure 2:
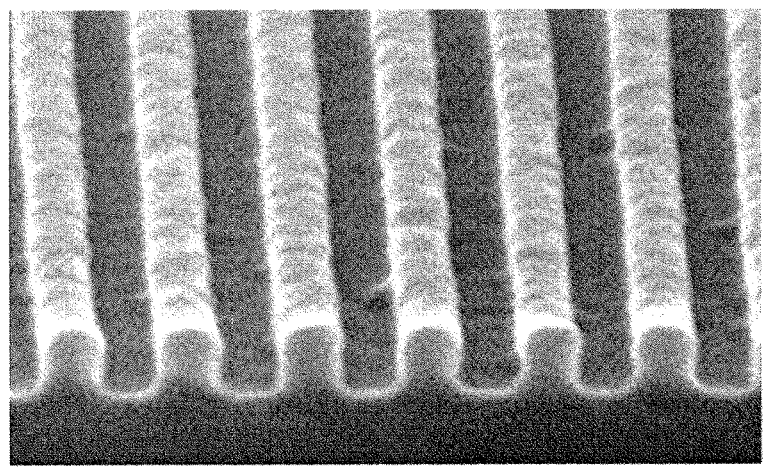
FIG. 2 is an electron microscopic photograph of a resist pattern having a line-and-space of 40 nm obtained in Example 1. The magnification is 150,000 times.
Figure 3:
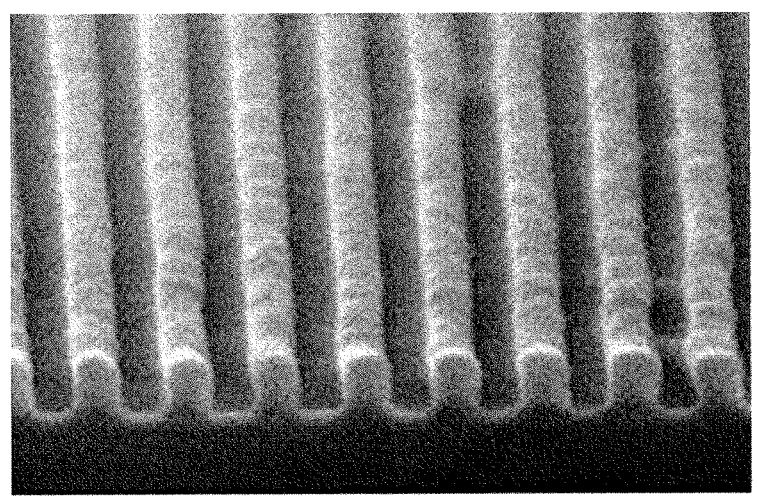
FIG. 3 is an electron microscopic photograph of a resist pattern having a line-and-space of 30 nm obtained in Example 1. The magnification is 150,000 times.

1 g of the resin obtained in Synthesis Example 1, 0.05 g of tetramethoxymethylglycoluril as a crosslinking agent, 0.003 g of pyridinium p-toluenesulfonate as a crosslinking catalyst, and 0.006 g of bis(4-hydroxyphenyl)sulfone as a pattern shape adjustment agent were dissolved in 88.96 g of propylene glycol monomethyl ether and 10 g of propylene glycol monomethyl ether acetate as solvents to obtain an electron beam resist underlayer film-forming composition.
The electron beam resist underlayer film-forming composition was applied onto a silicon wafer using a spinner. The applied composition was heated on a hot plate at 205° C. for 1 minute to form an electron beam resist underlayer film having a film thickness of 10 nm. Onto the resist underlayer film, an electron beam resist (manufactured by TOKYO OHKA KOGYO CO., LTD., trade name: OEBR-CAP164A3 M3) was applied by spin coating. The applied resist was heated at 100° C. for 60 seconds to form an electron beam resist.
Thereafter, an image was formed using an electron beam exposure apparatus (manufactured by ELIONIX INC., ELS-3700) under predetermined conditions. The image formation was carried out by irradiating with electron beams using a point-beam method. After the image formation, the sample was heated (PEB) at 100° C. for 60 seconds, cooled, and thereafter developed and rinsed to form a resist pattern. The target line width was determined to be line-and-spaces (L/S) of 30 nm to 50 nm to ascertain resolutions (refer to FIG. 1 to FIG. 3). It was found that every pattern had no pattern collapse and thus the resist patterns were resolved. Thereafter, the pattern was transferred to the resist underlayer film by dry etching and then, further, the substrate was processed.

Example 2

Example 2 was carried out in a similar manner to Example 1 except that 1 g of the resin obtained in Synthesis Example 2 was used instead of 1 g of the resin obtained in Synthesis Example 1.
The target line width was determined to be line-and-spaces (L/S) of 30 nm to 50 nm to ascertain resolutions and it was ascertained that the same results as the results of Example 1 were obtained.

Example 3

Example 3 was carried out in a similar manner to Example 1 except that 1 g of the resin obtained in Synthesis Example 3 was used instead of 1 g of the resin obtained in Synthesis Example 1.
The target line width was determined to be line-and-spaces (L/S) of 30 nm to 50 nm to ascertain resolutions and it was ascertained that the same results as the results of Example 1 were obtained.

Example 4

Example 4 was carried out in a similar manner to Example 1 except that 1 g of the resin obtained in Synthesis Example 4 was used instead of 1 g of the resin obtained in Synthesis Example 1.
The target line width was determined to be line-and-spaces (L/S) of 30 nm to 50 nm to ascertain resolutions and it was ascertained that the same results as the results of Example 1 were obtained.

Example 5

Example 5 was carried out in a similar manner to Example 1 except that 1 g of the resin obtained in Synthesis Example 5 was used instead of 1 g of the resin obtained in Synthesis Example 1.
The target line width was determined to be line-and-spaces (L/S) of 30 nm to 50 nm to ascertain resolutions and it was ascertained that the same results as the results of Example 1 were obtained.

Example 6

Example 6 was carried out in a similar manner to Example 1 except that 1 g of the resin obtained in Synthesis Example 6 was used instead of 1 g of the resin obtained in Synthesis Example 1.
The target line width was determined to be line-and-spaces (L/S) of 30 nm to 50 nm to ascertain resolutions and it was ascertained that the same results as the results of Example 1 were obtained.

Comparative Example 1

Comparative Example 1 was carried out in a similar manner to Example 1 except that 1 g of the resin obtained in Comparative Synthesis Example 1 was used instead of 1 g of the resin obtained in Synthesis Example 1.

Pattern collapses occurred in the target line width of line-and-spaces (L/S) of 30 nm to 50 nm and thus sharp resist patterns were not able to be obtained.

INDUSTRIAL APPLICABILITY

The present invention provides a resist underlayer film for electron beam lithography that can reduce adverse effects caused by a base substrate and electron beams, form an excellent resist pattern having a straight shape, cause no intermixing with a resist layer, and have higher dry etching rate than that of the resist.

The invention claimed is:

1. An electron beam resist underlayer film-forming composition comprising a polymer containing a unit structure having a lactone ring and a unit structure having a hydroxy group, and further comprising a polynuclear phenol wherein the polynuclear phenol is:

a compound of Formula (b-1):

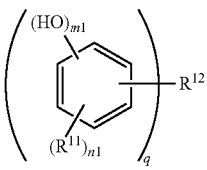

Formula (b-1)

(in Formula (b-1), $R^{11}$ is a substituent group of a hydrogen atom in a benzene ring, and is a hydroxy group, a halogen group, a $C_{1-10}$ alkyl group, a $C_{6-18}$ aryl group, a $C_{7-25}$ arylalkyl group, a $C_{2-10}$ alkylcarbonyl group, a $C_{2-10}$ alkylcarbonyloxy group, a $C_{2-10}$ alkylcarbonylamino group, a $C_{7-10}$ aryloxyalkyl group, a $C_{1-6}$ alkoxy group, or an organic group composed of a combination of these groups; $R^{12}$ is a single bond, a 2 to 4-valent $C_{1-10}$ hydrocarbon group optionally having a substituent of a halogen atom, a 2 to 4-valent $C_{7-25}$ arylalkyl group optionally having a substituent of a halogen atom, or a sulfonyl group; m1 is an integer of 1 to 5; n1 is an integer satisfying 0≤n1≤5−m1; and q is an integer of 2 to 4), a compound of Formula (b-2):

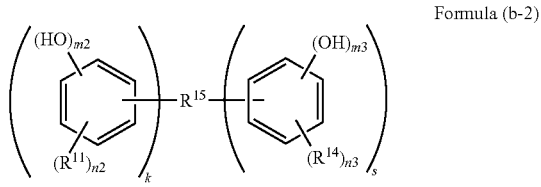

Formula (b-2)

(in Formula (b-2), $R^{13}$ and $R^{14}$ are each the same as $R^{11}$ in Formula (b-1); $R^{15}$ is a single bond, a 2 to 6-valent $C_{1-10}$ hydrocarbon group optionally having a substituent of a halogen atom, a 2 to 6-valent $C_{7-25}$ arylalkyl group optionally having a substituent of a halogen atom, or a sulfonyl group; m2 and m3 are each an integer of 1 to 5; n2 and n3 are an integer satisfying 0≤n2≤5−m2 and 0≤n3≤5−m3, respectively; and k and s are each an integer of 1 to 3)

a compound of Formula (b-3):

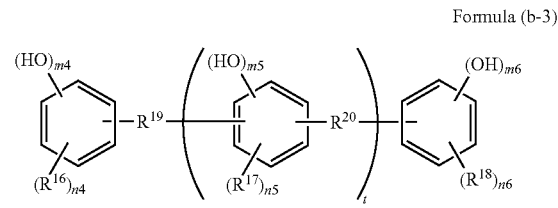

Formula (b-3)

(in Formula (b-3), $R^{16}$, $R^{17}$, and $R^{18}$ are each the same as $R^{11}$ in Formula (b-1); $R^{19}$ and $R^{20}$ are each a single bond, a bivalent $C_{1-10}$ hydrocarbon group optionally having a substituent of a halogen atom, a bivalent $C_{7-25}$ arylalkyl group optionally having a substituent of a halogen atom, or a sulfonyl group; m5 is an integer of 1 to 4; m4 and m6 are each an integer of 1 to 5; n5 is an integer satisfying 0≤n5≤4−m5; n4 and n6 are an integer satisfying 0≤n4≤5−m4 and 0≤n6≤5−m6, respectively; and t is an integer of 1 to 4), or a combination thereof.

2. The electron beam resist underlayer film-forming composition according to claim 1, wherein the polymer is a polymer further containing a unit structure having an aryl group or an arylalkyl group.

3. The electron beam resist underlayer film-forming composition according to claim 1, wherein the polymer is a polymer obtained by copolymerizing a monomer mixture containing a lactone (meth)acrylate and a hydroxyalkyl (meth)acrylate.

4. The electron beam resist underlayer film-forming composition according to claim 1, wherein the polymer is a polymer obtained by copolymerizing a monomer mixture containing a lactone (meth)acrylate, a hydroxyalkyl (meth)acrylate, and phenyl (meth)acrylate or benzyl (meth)acrylate.

5. The electron beam resist underlayer film-forming composition according to claim 1, wherein the polymer is a polymer of Formula (1) containing a unit structure of Formula (1-1) and a unit structure of Formula (1-2) or a polymer of Formula (2) containing a unit structure of Formula (2-1), a unit structure of Formula (2-2), and a unit structure of Formula (2-3):

Formula (1)

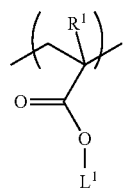

Formula (1-1)

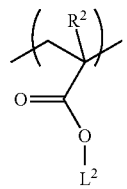

Formula (1-2)

Formula (2)

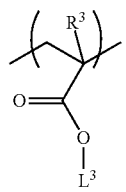
Formula (2-1)

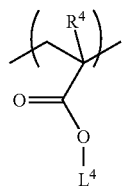
Formula (2-2)

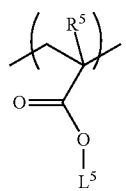
Formula (2-3)

[where $R^1$, $R^2$, $R^3$, $R^4$, and $R^5$ are each a hydrogen atom or a methyl group; $L^2$ and $L^4$ are each a $C_{1-10}$ hydroxyalkyl group; $L^5$ is a phenyl group or a benzyl group; and $L^1$ and $L^3$ are each Formula (L1-1) or (L1-2):

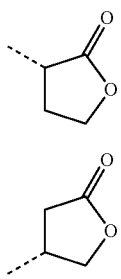
Forumla (L1-1)

Formula (L1-2)

(where dashed lines are chemical bonds with ester groups of Formula (1-1) and Formula (2-1)).

6. The electron beam resist underlayer film-forming composition according to claim 1, further comprising a cross-linkable compound.

7. The electron beam resist underlayer film-forming composition according to claim 1, further comprising an acid compound.

8. A method for forming an electron beam resist underlayer film used for a lithography process of semiconductor device production, comprising:
applying the electron beam resist underlayer film-forming composition as claimed in claim 1 onto a substrate, and
heating the applied composition.

9. A method for producing a semiconductor device, the method comprising:
applying the electron beam resist underlayer film-forming composition as claimed in claim 1 onto a substrate and heating the applied composition to form an electron beam resist underlayer film;
coating the electron beam resist underlayer film with an electron beam resist;
irradiating the substrate coated with the electron beam resist underlayer film and the electron beam resist with an electron beam;
developing the substrate; and
transferring an image onto the substrate by dry etching to form an integrated circuit element.

10. The electron beam resist underlayer film-forming composition according to claim 1, wherein the polynuclear phenol comprises a compound of Formula (b-1).

11. The electron beam resist underlayer film-forming composition according to claim 1, wherein the polynuclear phenol comprises a compound of Formula (b-2).

12. The electron beam resist underlayer film-forming composition according to claim 1, wherein the polynuclear phenol comprises a compound of Formula (b-3).

* * * * *